United States Patent
Shinoda et al.

(10) Patent No.: US 9,910,351 B2
(45) Date of Patent: Mar. 6, 2018

(54) IMPRINT APPARATUS AND ARTICLE MANUFACTURING METHOD

(71) Applicant: CANON KABUSHIKI KAISHA, Tokyo (JP)

(72) Inventors: Ken-ichiro Shinoda, Utsunomiya (JP); Akiyoshi Suzuki, Tokyo (JP); Mitsuru Hiura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/364,923

(22) Filed: Nov. 30, 2016

(65) Prior Publication Data
US 2017/0080633 A1 Mar. 23, 2017

Related U.S. Application Data

(63) Continuation of application No. 13/741,562, filed on Jan. 15, 2013, now Pat. No. 9,541,825.

(30) Foreign Application Priority Data

Jan. 16, 2012 (JP) .................................. 2012-006557

(51) Int. Cl.
*G03F 7/00* (2006.01)
*B29C 59/02* (2006.01)
(Continued)

(52) U.S. Cl.
CPC .......... *G03F 7/0002* (2013.01); *B29C 43/021* (2013.01); *B29C 43/58* (2013.01);
(Continued)

(58) Field of Classification Search
None
See application file for complete search history.

(56) References Cited

U.S. PATENT DOCUMENTS 5,669,303 A 9/1997 Maracas et al.
7,531,821 B2 5/2009 Suehira et al.
(Continued)

FOREIGN PATENT DOCUMENTS

JP H04-102019 A 4/1992
JP H09-240125 A 9/1997
(Continued)

OTHER PUBLICATIONS

Office Action issued in Japanese Patent Application No. 2012-006557, dated Nov. 20, 2015.
(Continued)

*Primary Examiner* — Benjamin A Schiffman
(74) *Attorney, Agent, or Firm* — Rossi, Kimms & McDowell LLP

(57) ABSTRACT

An apparatus for bringing a mold having a pattern region and a first mark into contact with an imprint material on a substrate having a second mark, includes a deforming mechanism configured to deform the mold such that a portion of the mold where the first mark is formed protrudes toward the substrate, a driving mechanism configured to adjust a distance between the mold and the substrate, and a detecting unit configured to detect, after the driving mechanism starts an operation of reducing the distance, the first mark and the second mark in a state in which the portion of the mold and the imprint material on the substrate are in contact with each other but a whole of the pattern region is not in contact with the imprint material.

10 Claims, 11 Drawing Sheets

(51) Int. Cl.
  *B82Y 10/00* (2011.01)
  *B82Y 40/00* (2011.01)
  *B29C 43/02* (2006.01)
  *B29C 43/58* (2006.01)

(52) U.S. Cl.
  CPC .............. *B29C 59/02* (2013.01); *B82Y 10/00* (2013.01); *B82Y 40/00* (2013.01); *B29C 2059/023* (2013.01)

(56) References Cited

U.S. PATENT DOCUMENTS

| | | | |
|---|---|---|---|
| 7,592,108 | B2 | 9/2009 | Yamaguchi et al. |
| 7,691,313 | B2 | 4/2010 | Choi et al. |
| 8,764,431 | B2 | 7/2014 | Yamashita et al. |
| 2005/0212156 | A1 | 9/2005 | Tokita et al. |
| 2006/0158651 | A1 | 7/2006 | Watts et al. |
| 2009/0243126 | A1 | 10/2009 | Washiya et al. |
| 2011/0290136 | A1 | 12/2011 | Koga |

FOREIGN PATENT DOCUMENTS

| | | |
|---|---|---|
| JP | 2004335910 A | 11/2004 |
| JP | 2005286062 A | 10/2005 |
| JP | 2008100507 A | 5/2008 |
| JP | 2008524854 A | 7/2008 |
| JP | 2009517882 A | 4/2009 |
| JP | 2009241330 A | 10/2009 |
| JP | 2011071191 A | 4/2011 |
| JP | 2011211157 A | 10/2011 |
| JP | 2012099790 A | 5/2012 |
| KR | 20090002828 A | 1/2009 |
| KR | 20110132238 A | 12/2011 |
| WO | 2006066016 A2 | 6/2006 |
| WO | 2007064386 A1 | 6/2007 |

OTHER PUBLICATIONS

Office Action issued in Korean Patent Application No. 1020130004284, dated Feb. 13, 2015.
Office Action issued in U.S. Appl. No. 13/741,562, dated Oct. 9, 2015.
Office Action issued in U.S. Appl. No. 13/741,562, dated Apr. 13, 2016.
Notice of Allowance issued in U.S. Appl. No. 13/741,562, dated Aug. 31, 2016.

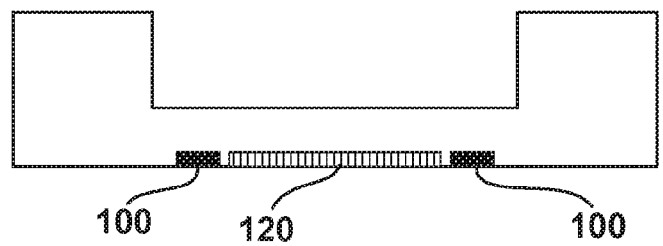
FIG. 8
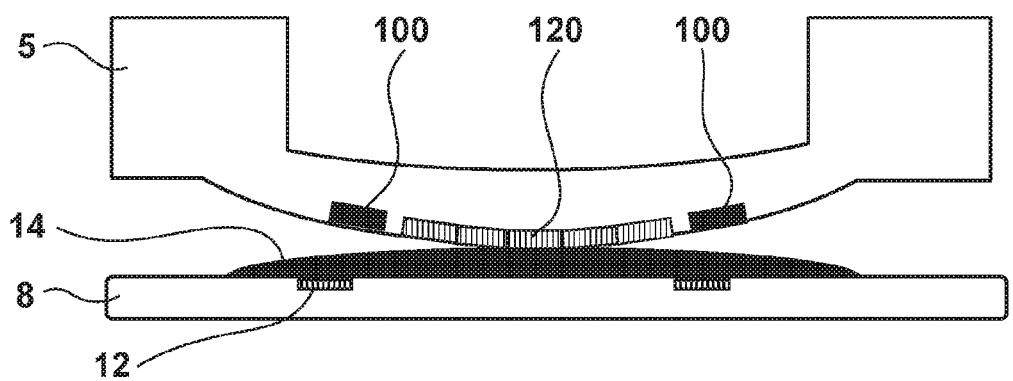
FIG. 9A
FIG. 9B
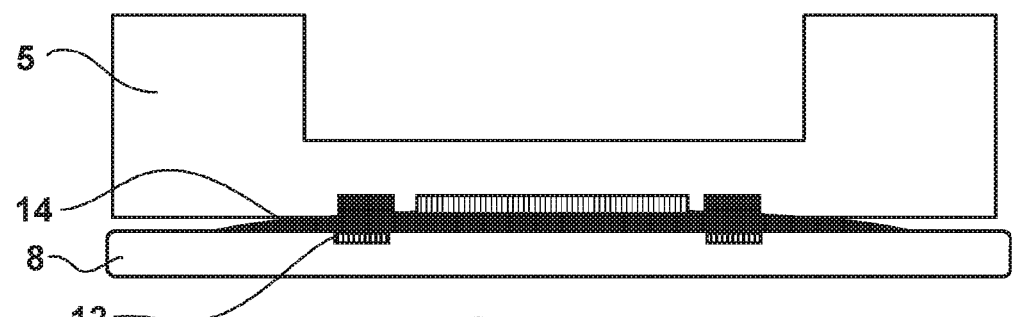
FIG. 10
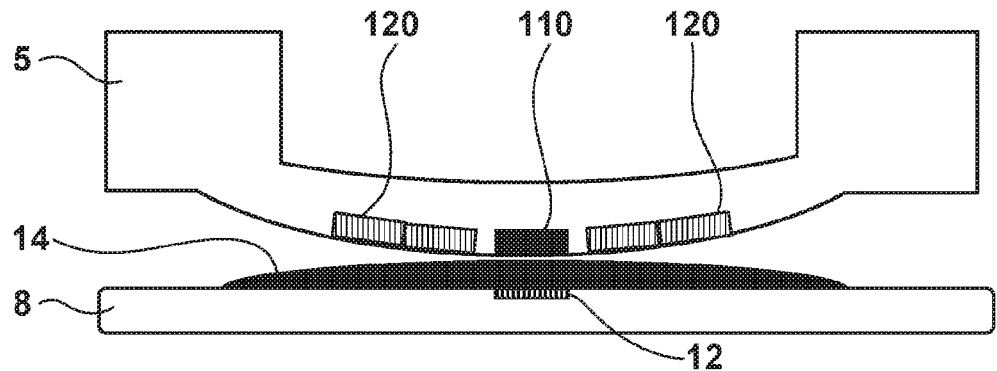

IMPRINT APPARATUS AND ARTICLE MANUFACTURING METHOD

BACKGROUND OF THE INVENTION

Field of the Invention

The present invention relates to an imprint apparatus for bringing a mold having a pattern region in which a pattern is formed into contact with an imprint material on a substrate and transferring the pattern to the imprint material, and a method of manufacturing an article by using the apparatus.

Description of the Related Art

Recently, as demands for micropatterning semiconductor devices increase, an imprint technique of transferring a fine pattern formed on a mold to an imprint material on a substrate is attracting attention, in addition to the conventional photolithography technique. This imprint technique is useful in the formation of nanoscale patterns, and also called a nanoimprint technique. An example of the imprint technique is a method using an optical imprint system in the semiconductor manufacturing technique as disclosed in Japanese Patent Laid-Open No. 2005-286062. In this method, a resin as one of examples of an imprint material is dispensed on a substrate such as a semiconductor wafer, a mold having a desired fine three-dimensional structure is pressed against the resin, and the resin is cured by irradiation with ultraviolet light in this state. Consequently, the three-dimensional structure of the mold is transferred to the resin. A layer below the resin can be processed by etching the layer by using the resin as an etching mask. An imprint apparatus does not require any projecting optical system or the like, and hence is superior in space saving and cost to a photolithography type semiconductor exposure apparatus. Also, Japanese Patent Laid-Open No. 2009-517882 describes a technique by which the mold is deformed into a projecting shape, the central portion and its vicinity of the mold are first brought into contact with the resin on the substrate, and then the contact region is gradually extended from the central portion to the peripheral portion, in order to shorten the time required to fill the resin in recesses of the mold, and reduce the force required to release the mold from the resin.

In the imprint apparatus, the mold and substrate are physically brought into contact with each other with the resin being sandwiched between them. Therefore, a force is applied to the substrate when the mold is brought into contact with the substrate and released from the cured resin, and the substrate sometimes moves from the original position. If an imprint (pattern transfer) operation is performed on the next shot region with the substrate being kept moved from the original position, an overlay error may occur. Accordingly, demands have arisen for so-called, die-by-die alignment by which the substrate and mold are aligned for each shot region.

The imprint apparatus can adopt a through the mold detecting system (to be referred to as a TTM detecting system hereinafter) capable of directly aligning the mold and substrate. In the imprint apparatus, an irradiation system is positioned above the mold so as to irradiate the resin with ultraviolet light through the mold, and the TTM detecting system is positioned to get out of the way of the irradiation system.

The vicinity of the irradiation system positioned above the mold is a crowded place because various parts such as an imprint head for holding the mold and a driving cable connected to the head are arranged. Therefore, the TTM detecting system must be positioned to avoid interference with the irradiation system and a light beam for curing, and hence is conventionally inclined to the optical axis of the irradiation system. Also, alignment marks are arranged in the peripheral portion of a region to be irradiated with the curing light.

On the other hand, when the mold is deformed and the vicinity of its central portion is first brought into contact with the substrate, if alignment marks are arranged in the peripheral portion of the mold, the alignment operation must wait until the peripheral portion comes in contact with the resin.

SUMMARY OF THE INVENTION

The present invention provides a technique advantageous for increasing the efficiency of the detection of the relative positions of a mold and substrate, thereby increasing the throughput.

One of the aspects of the present invention provides an imprint apparatus for bringing a mold having a pattern region in which a pattern is formed and a first mark into contact with an imprint material on a substrate having a second mark to transfer the pattern to the imprint material, the apparatus comprising: a deforming mechanism configured to deform the mold such that a portion of the mold where the first mark is formed protrudes toward the substrate; a driving mechanism configured to adjust a distance between the mold and the substrate such that the mold and the imprint material on the substrate come in contact with each other; and a detecting unit configured to detect, after the driving mechanism starts an operation of reducing the distance, the first mark and the second mark in a state in which the portion of the mold and the imprint material on the substrate are in contact with each other but a whole of the pattern region is not in contact with the imprint material, wherein the detecting unit includes a photoelectric conversion device, a relay optical system, and an illuminating and imaging system placed between the photoelectric conversion device and the relay optical system, and the illuminating and imaging system illuminates the substrate through the relay optical system so as to form, on the photoelectric conversion device, images of intermediate images of the first mark and the second mark, the intermediate images being formed at a position between the relay optical system and the illuminating and imaging system with light from the substrate.

Further features of the present invention will become apparent from the following description of exemplary embodiments with reference to the attached drawings.

BRIEF DESCRIPTION OF THE DRAWINGS

FIG. 8 is a view showing an arrangement example of a mold;

FIGS. 9A and 9B are views showing a pattern transfer procedure;

FIG. 10 is a view showing the layout of alignment marks and the deformation of a mold according to an embodiment of the present invention;

DESCRIPTION OF THE EMBODIMENTS

Figure 1:
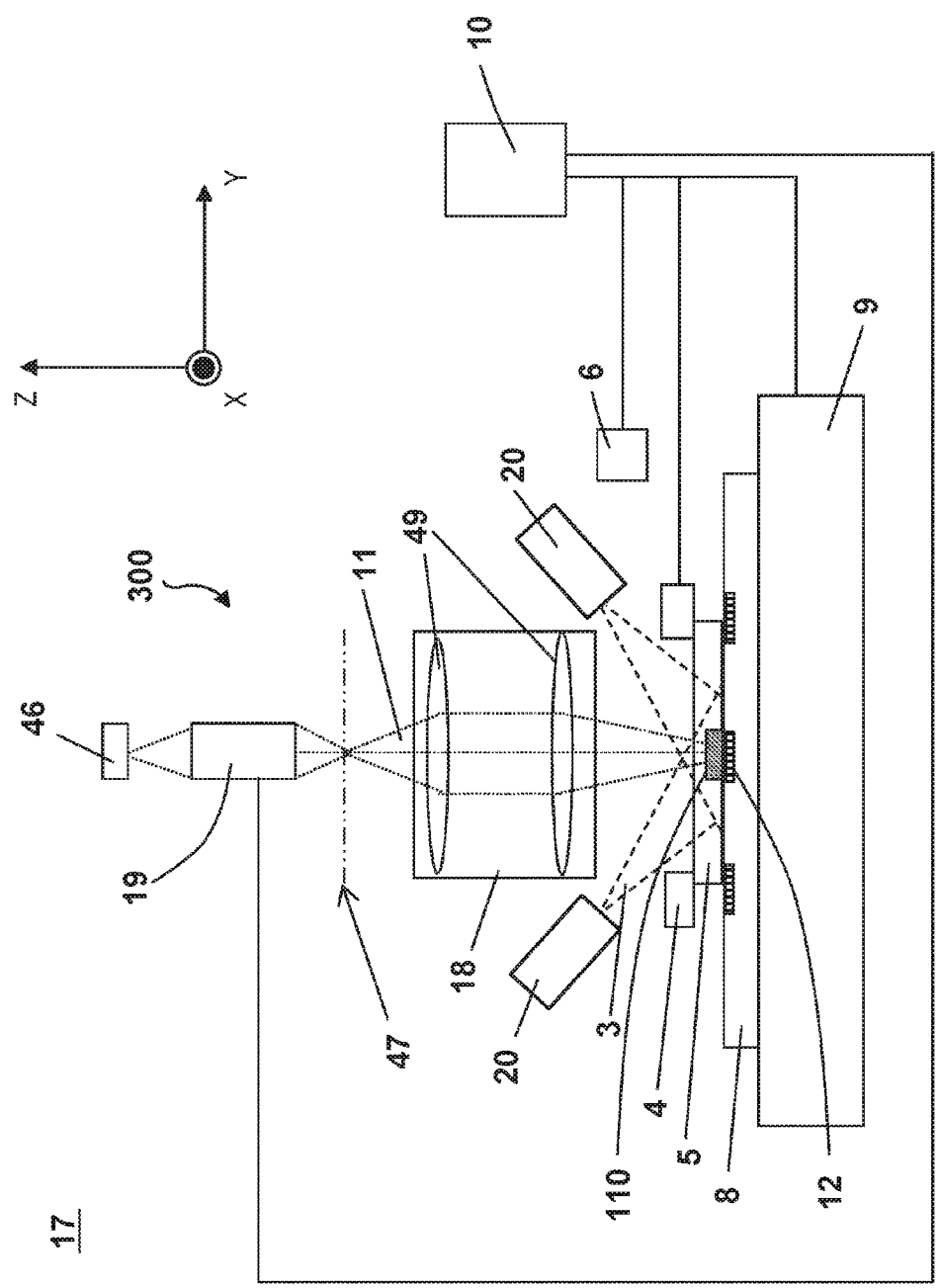
FIG. 1 is a view showing the arrangement of an imprint apparatus according to the first embodiment of the present invention.

First, an imprint apparatus 1 as a comparative example will be explained with reference to FIG. 6. The imprint apparatus 1 can include an irradiation system 2 for curing a resin as one of examples of an imprint material, a substrate stage 9 for holding a substrate (for example, a wafer) 8, an imprint head 4 for holding and driving a mold 5, a TTM detecting system 7, a coating mechanism (dispenser) 6, and a control unit 10.

Figure 14:
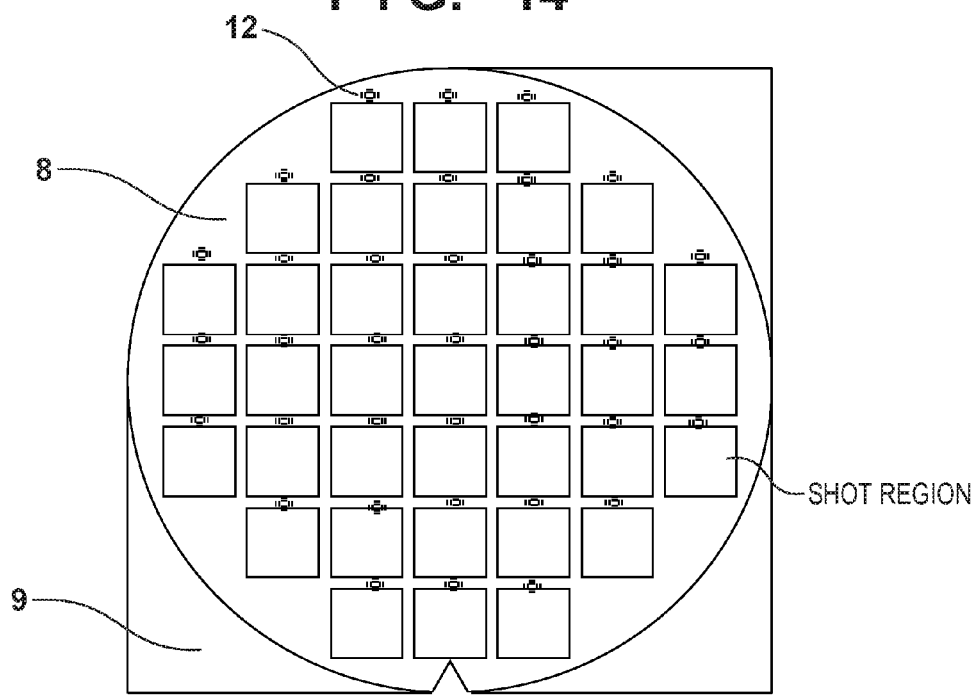
FIG. 14 is a view showing an example of the layout of substrate-side alignment marks.

The TTM detecting system 7 can detect the relative positions of a mold-side alignment mark 100 formed on the mold 5 and substrate-side alignment marks 12 (FIGS. 6 and 14) formed on the substrate 8. The TTM detecting system 7 irradiates the mold-side alignment mark 100 formed on the mold 5 and the substrate-side alignment marks 12 formed on the substrate 8 with measurement light 11 (for example, visible light or infrared light) by using an internal light source. The TTM detecting system 7 includes a photoelectric conversion device (for example, a CCD) for detecting reflected light from the mold-side alignment mark 100 and substrate-side alignment marks 12, and detects the relative positions of the mold 5 and substrate 8 based on a signal from the photoelectric conversion device. It is also possible to detect the relative positions of the mold-side alignment mark 100 and substrate-side alignment marks 12 in the Z direction by focusing these alignment marks. The TTM detecting system 7 supplies the detection result to the control unit 10. Based on the detection result from the TTM detecting system 7, the control unit 10 drives at least one of the substrate stage 9 and imprint head 4 in the X and Y directions, thereby aligning the substrate 8 and mold 5 in the X and Y directions.

When the TTM detecting system 7 detects the relative positions of the mold 5 and substrate 8, interference fringes may be generated if monochromatic light is used because a resin is dispensed on the substrate-side alignment marks 12. Consequently, an alignment signal to which an interference fringe signal is added may be detected, and so the accuracy may decrease. Also, light in the ultraviolet region may cure the resin dispensed on the substrate-side alignment marks 12. As an illumination light source of the TTM detecting system 7, therefore, it is possible to use light having a wavelength that does not cure a resin over a broad band.

When the alignment of the substrate 8 and mold 5 is complete, a pattern formed in a pattern region of the mold 5 is transferred (imprinted) to the resin on the substrate 8. The imprint head 4 includes a driving mechanism for adjusting the distance between the mold 5 and substrate 8, and drives the mold 5 by using the driving mechanism, thereby bringing the pattern region into contact with the resin that has been dispensed on the substrate 8 by the coating mechanism (dispenser) 6. In this state, the irradiation system 2 irradiates the resin with ultraviolet light 3 in order to cure the resin. When the resin is cured, the imprint head 4 releases the mold 5 from the resin. Instead of driving the mold 5 with the imprint head 4, it is also possible to adjust the distance between the mold 5 and substrate 8 by driving the substrate stage 9 with its driving mechanism, and bring the resin on the substrate 8 into contact with the pattern region of the mold 5.

Figure 7A:
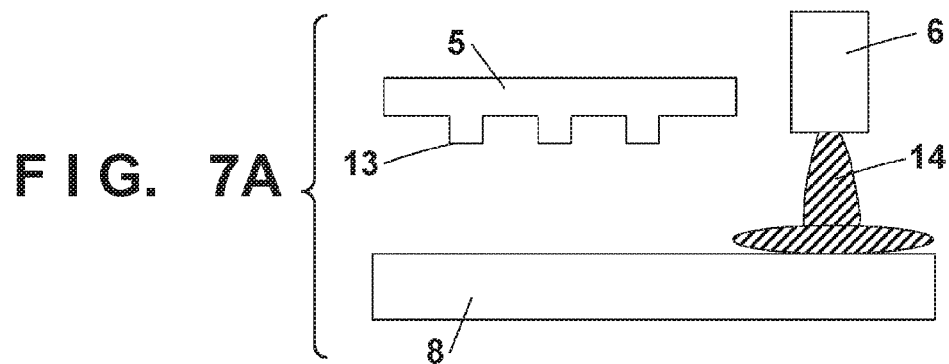
FIGS. 7A to 7D are views showing a pattern formation method in the imprint apparatus.
Figure 7B:
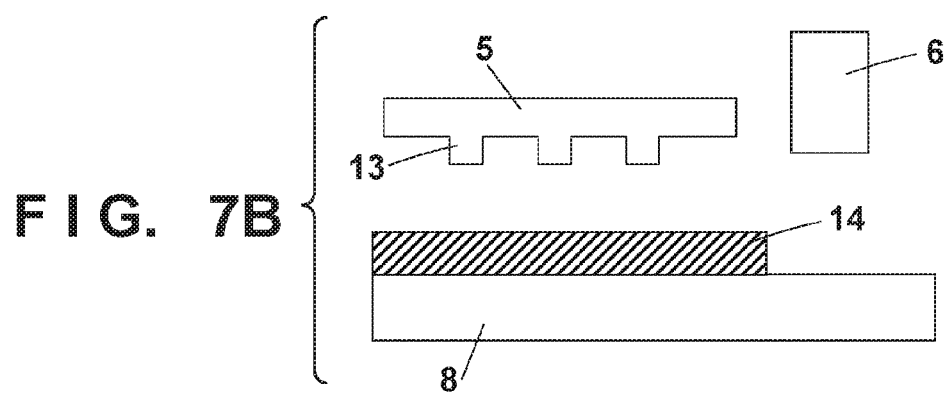
Figure 7C:
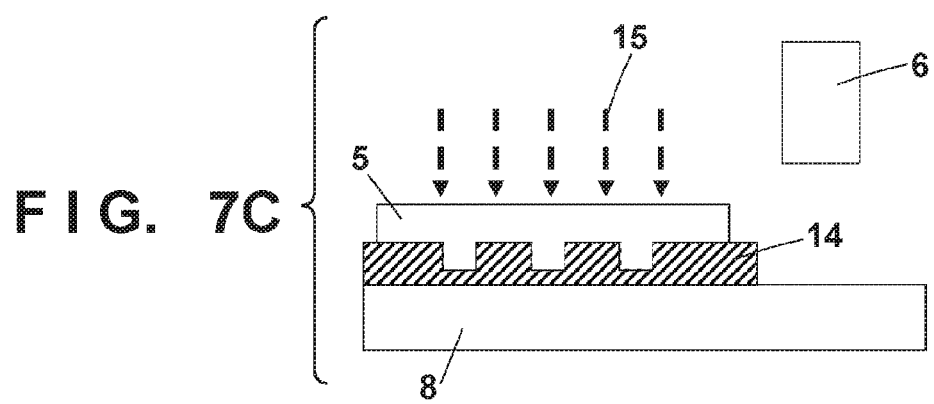
Figure 7D:
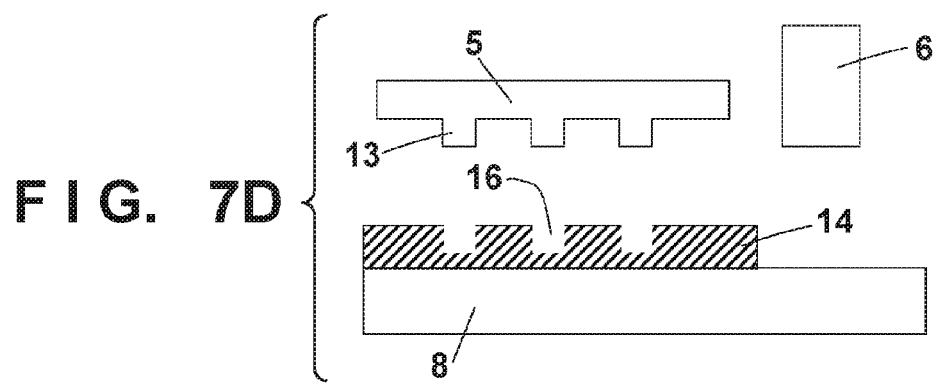

A pattern formation method in the imprint apparatus 1 will be explained below with reference to FIGS. 7A to 7D. A pattern 13 is formed in the pattern region of the mold 5. First, as shown in FIG. 7A, the coating mechanism 6 dispenses a resin 14 on a shot region of the substrate 8. Then, as shown in FIG. 7B, the driving mechanism drives the substrate stage 9 so that the shot region of the substrate 8, on which the resin 14 was dispensed, is positioned immediately below the mold 5. Subsequently, as shown in FIG. 7C, the pattern region of the mold 5 is pressed against the resin 14 on the shot region of the substrate 8. In this state, the irradiation system 2 irradiates the resin 14 with ultraviolet light 15 for curing the resin 14, thereby curing the resin 14. Finally, as shown in FIG. 7D, the mold 5 is released from the resin 14. Consequently, the pattern 13 formed in the pattern region of the mold 5 is transferred as a pattern 16 to the resin 14. The pattern 16 is equivalent to a resist pattern in photolithography. The process as described above is performed on all shot regions on the substrate 8.

Figure 15:
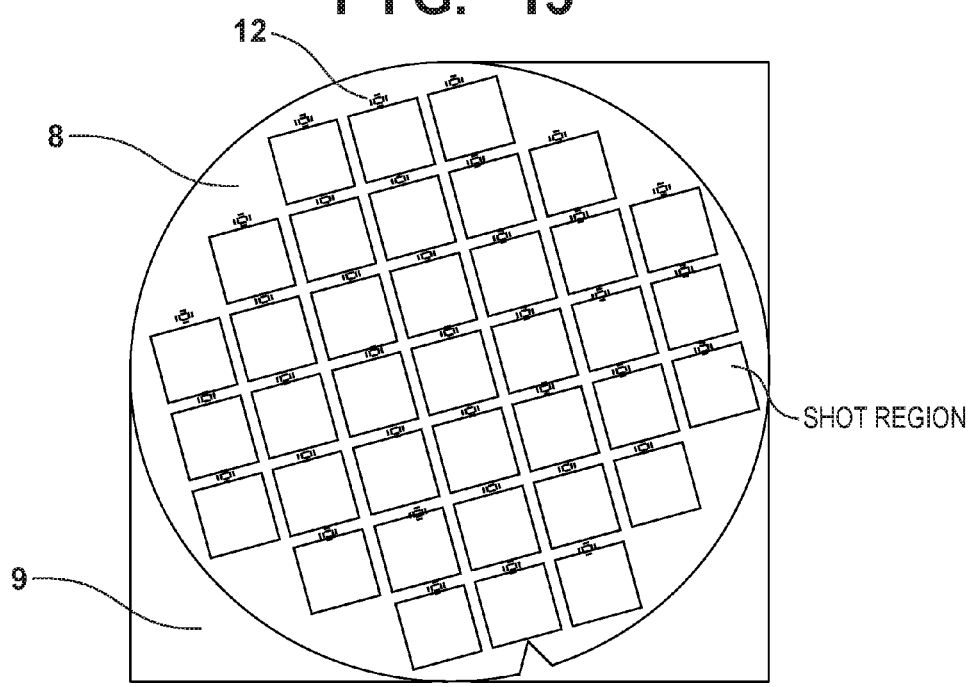
FIG. 15 is a view showing a state in which a substrate is shifted from a substrate stage.

In this process, a force is applied to the substrate 8 when the mold 5 is brought into contact with the resin on the substrate 8 and released from the resin, and the position of the substrate 8 is sometimes shifted from the substrate stage 9 as shown in FIG. 15. If pattern transfer is performed on the next shot region in the state in which the substrate 8 is shifted from the substrate stage 9, an overlay error occurs between an underlying pattern and a pattern to be formed on it, and this may decrease the yield of devices. Therefore, after the pattern is transferred to the resin on a shot region and the mold 5 is released from the resin and before the pattern is transferred onto the next shot region, the next shot region of the substrate 8 and the mold 5 must be aligned. This alignment is called die-by-die alignment.

FIG. 8 is a view showing a more practical arrangement example of the mold 5. To shorten the time required to fill the resin in recesses of the pattern and reduce the force required to release the mold 5 from the resin, the mold 5 can be deformed to protrude the pattern region toward the substrate. The mold 5 includes a pattern region 120 in which a pattern is formed, and the mold-side alignment marks 100. When transferring the pattern to the resin, as shown in FIG. 9A, the mold 5 is first deformed to protrude the central portion of the mold 5 toward the substrate 8, thereby bringing the central portion of the mold 5 into contact with the resin 14 on the substrate 8. After that, the contact region is gradually extended from the central portion to the peripheral portion. Finally, as shown in FIG. 9B, the whole of the pattern region 120 is brought into contact with the resin.

Figure 6:
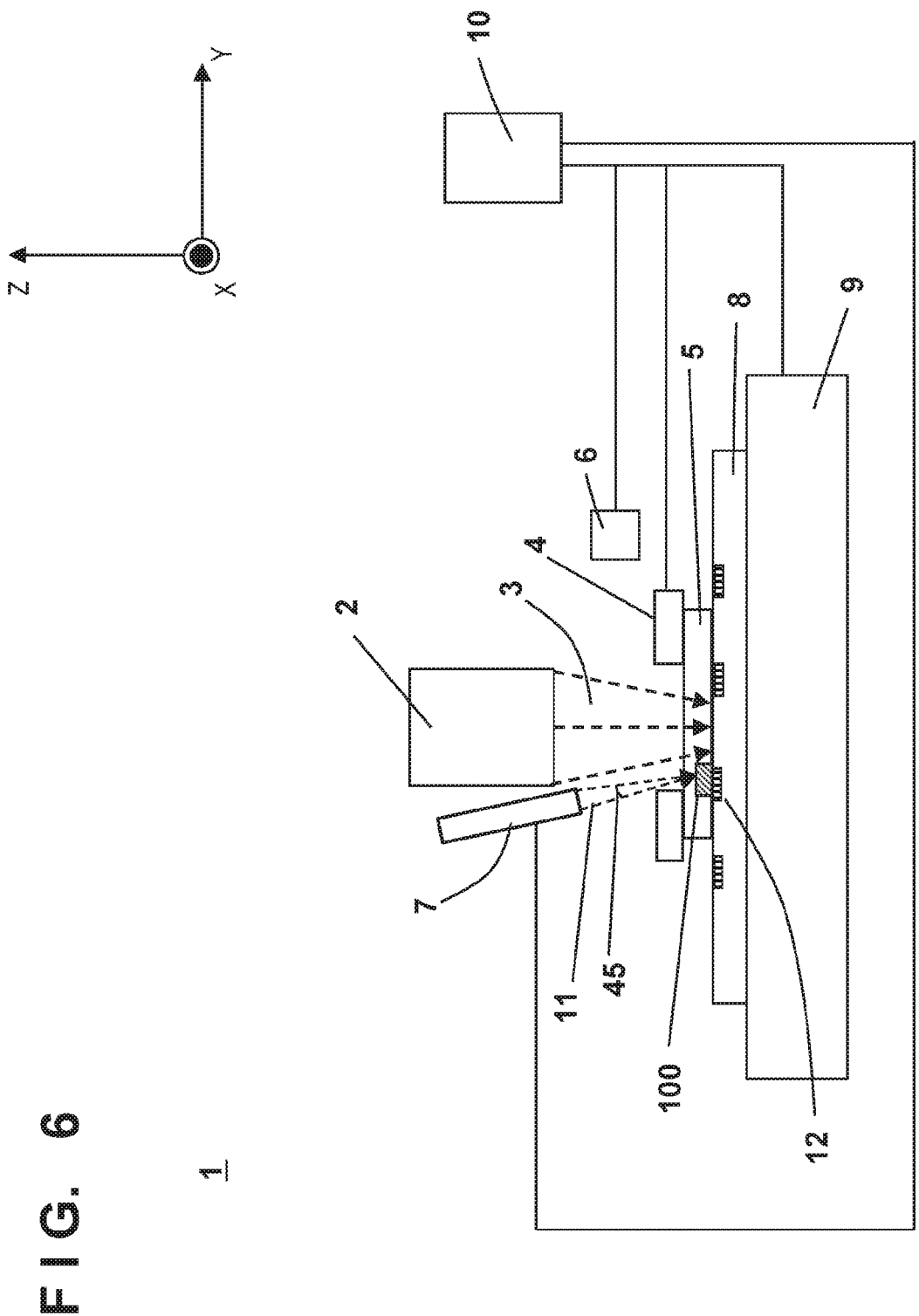
FIG. 6 is a view showing the arrangement of an imprint apparatus as a comparative example.

In the imprint apparatus 1 as a comparative example shown in FIG. 6, the TTM detecting system 7 is placed to get out of the way of the irradiation system 2 and the light path of the ultraviolet light 3. Accordingly, it is impossible to detect the relative positions of the mold-side alignment marks 100 and substrate-side alignment marks 12 until the peripheral portion of the pattern region 120 of the mold 5 is brought into contact with the resin 14 as shown in FIG. 9B.

In an embodiment of the present invention to be described below, therefore, as shown in FIG. 10, a mold-side alignment mark (first mark) 110 is formed in a portion where the mold 5 and resin 14 start partially contacting each other. A substrate-side alignment mark (second mark) 12 is formed to correspond to the position of the mold-side alignment mark. This makes it possible to observe the alignment marks from the timing at which the mold 5 and the resin 14 on the substrate 8 start partially contacting each other. In addition, in the embodiment of the present invention to be described below, a TTM detecting system is positioned to facilitate observing the alignment marks as described above.

Figure 11:
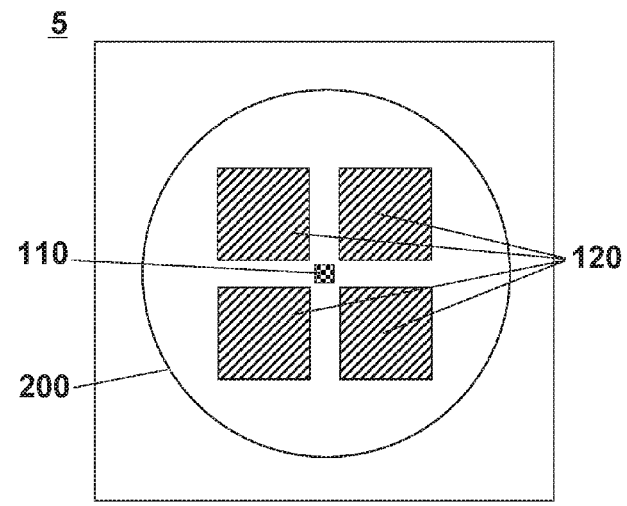
FIG. 11 is a view showing the layout of alignment marks according to an embodiment of the present invention.

FIG. 11 shows a mold 5 according to an embodiment of the present invention. In the example shown in FIG. 11, the mold 5 has pattern regions 120 of four chips, and patterns in the four chip regions are transferred to a resin on a substrate by one transfer operation. The central portion of the mold 5 is a gap (scribe region) between the chips. Accordingly, even when a mold-side alignment mark 110 is formed in the central portion of the mold 5, the mark has no influence on the pattern regions 120. Note that a region denoted by reference numeral 200 is a thin portion that facilitates the deformation of the mold 5.

Since the mold-side alignment mark (first mark) 110 is formed in the central portion as a portion where the mold starts contacting the resin, the relative positions of a substrate 8 and the mold 5 can be detected at an early timing after an operation of reducing the distance between the mold 5 and substrate 8 is started. That is, after the operation of reducing the distance is started, the relative positions of the substrate 8 and mold 5 can be detected in a state in which the central portion of the mold 5 is in contact with the resin on the substrate 8 but the pattern regions 120 are not entirely in contact with the resin. Consequently, the timing at which the alignment of the substrate 8 and mold 5 is started can be made earlier, thereby increasing the throughput. In addition, the force required to align the substrate 8 and mold 5 decreases because they can be aligned while the area of the contact portion between the mold 5 and resin 14 is small. This is advantageous for preventing the displacement of the substrate 8 or mold 5. Note that in the example shown in FIG. 11, the portion where the mold starts contacting the resin (the portion where the mold-side alignment mark is formed) is the central portion of the mold 5. However, this portion may also be another portion (for example, a portion (for example, a corner) of the peripheral portion).

Figure 16:
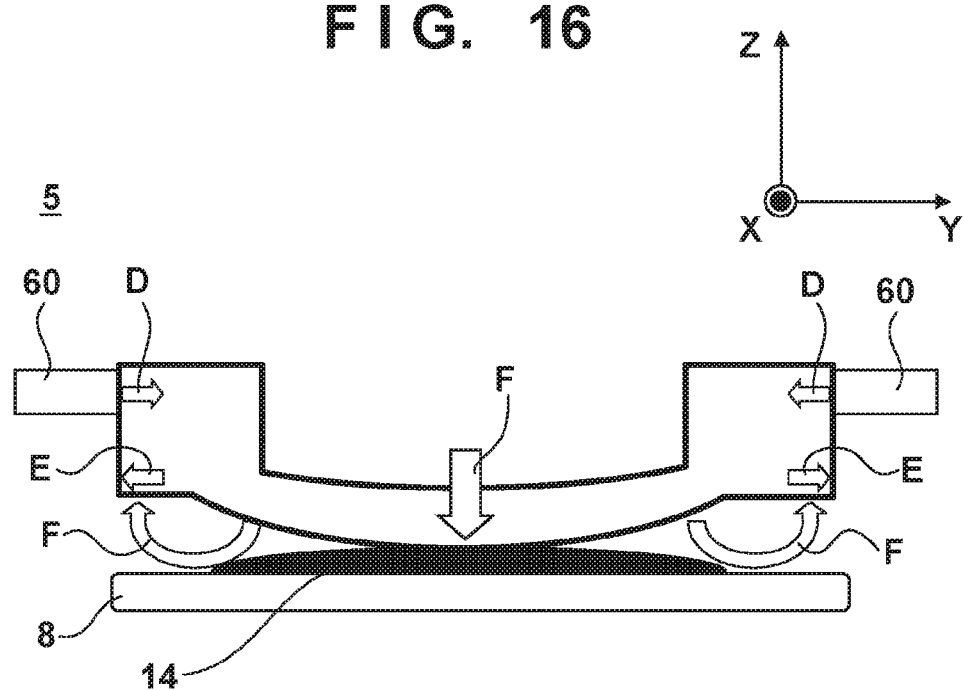
FIG. 16 is a view showing an example of a deforming mechanism for deforming a mold.

FIG. 16 shows an example of a deforming mechanism of deforming the mold 5 so that the portion of the mold 5 where the mold-side alignment mark (first mark) is formed protrudes toward the substrate 8. A deforming mechanism 60 shown in FIG. 16 causes a compressing force D to act on the mold 5. By this action, an outward force E acts on the lower portion of the peripheral portion of the mold 5. Consequently, a force F that deforms the mold 5 such that the central portion of the mold 5, that is, the portion where the mold-side alignment mark (first mark) is formed protrudes toward the substrate is applied to the mold 5.

Figure 17:
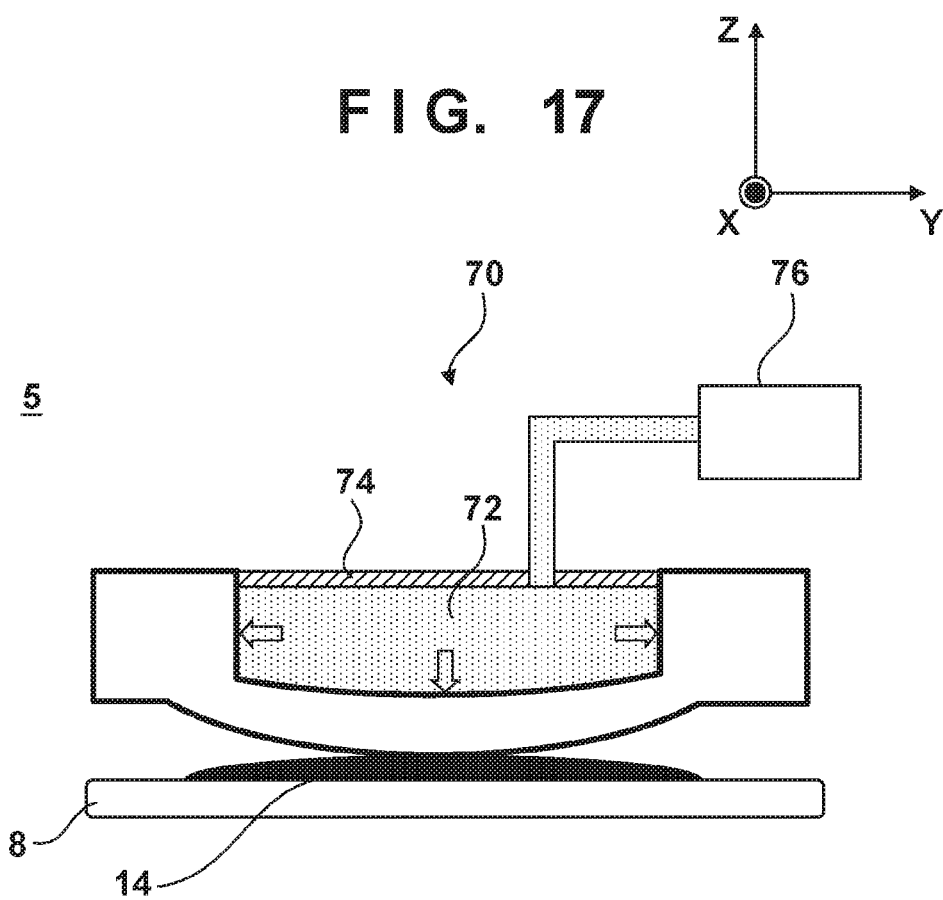
FIG. 17 is a view showing another example of the deforming mechanism for deforming a mold.

FIG. 17 shows another example of the deforming mechanism of deforming the mold 5 so that the portion of the mold 5 where the mold-side alignment mark (first mark) is formed protrudes toward the substrate 8. A deforming mechanism 70 shown in FIG. 17 includes a member 74 for forming a closed space 72 on the rear-surface side (the side opposite to the pattern formation surface) of the mold 5, and a pressure adjusting unit 76 for adjusting the pressure of the closed space 72. When the pressure adjusting unit 76 makes the pressure of the closed space 72 higher than that of the external space, the mold 5 can be deformed such that the central portion of the mold 5, that is, the portion where the mold-side alignment mark (first mark) is formed protrudes toward a substrate.

An imprint apparatus 17 of the first embodiment of the present invention will be explained below with reference to FIG. 1. Note that features not mentioned in the following explanation can follow the comparative example explained with reference to FIG. 6. The imprint apparatus 17 brings a mold 5 having a pattern region where a pattern is formed and a mold-side alignment mark (first mark) into contact with a resin supplied on a substrate having a substrate-side alignment mark (second mark) 12, thereby transferring the pattern to the resin. The imprint apparatus 17 includes an irradiation system 20 for curing the resin, a substrate stage 9 for holding a substrate 8, an imprint head 4 for holding and driving the mold 5, a TTM detecting system (detecting unit) 300, a coating mechanism 6, and a control unit 10.

The TTM detecting system 300 includes a photoelectric conversion device (for example, a CCD) 46, a relay optical system 18, and an illuminating and imaging system 19 positioned between the photoelectric conversion device 46 and relay optical system 18. The illuminating and imaging system 19 illuminates the substrate 8 through the relay optical system 18. Also, the illuminating and imaging system 19 forms, on the photoelectric conversion device 46, images of intermediate images of a mold-side alignment mark 110 and the substrate-side alignment mark 12. The intermediate images are formed on an intermediate imaging plane 47 between the relay optical system 18 and illuminating and imaging system 19 by light from the substrate 8. The intermediate imaging plane 47 is a plane conjugate with the surface of the substrate 8 and the light-receiving surface of the photoelectric conversion device 46. The relay optical system 18 can be either an equal-magnification system or enlarging system. The relay optical system 18 can include, for example, two lenses 49, but is not limited to this arrangement. The relay operation system 18 is preferably a telecentric optical system.

The illuminating and imaging system 19 can be positioned above the relay optical system 18. Measurement light 11 emitted from the illuminating and imaging system 19 passes through the relay optical system 18 and irradiates the mold 5 and substrate 8. The relay optical system 18 forms, on the intermediate imaging plane 47, the intermediate images of the mold-side alignment mark 110 and substrate-side alignment mark 12 by reflected light from the mold 5 and substrate 8. The illuminating and imaging system 19 forms, on the light-receiving surface of the photoelectric conversion device 46, images of the intermediate images of the mold-side alignment mark 110 and substrate-side alignment marks 12. The intermediate images are formed on the intermediate imaging plane 47. By processing an output signal from the photoelectric conversion device 46, the relative positions of the mold-side alignment mark 110 and mold-side alignment mark 12, that is, the relative positions of the mold 5 and substrate 8 are detected. The control unit 10 controls the position of the substrate stage 9 so as to align the mold 5 and substrate 8 based on the detection result from the TTM detecting system 300.

As in the arrangement shown in FIG. 1, the optical axis of the TTM detecting system 300 is preferably perpendicular to the surface of the substrate 8. The TTM detecting system 300 can be configured to measure the relative positions of the mold 5 and substrate 8 in parallel with an operation of reducing the distance between the mold 5 and substrate 8 by the driving mechanism of the imprint head 4 and/or the driving mechanism of the substrate stage 9. The control unit 10 can position the substrate stage 9 so as to relatively align the mold 5 and substrate 8 in parallel with the operation of reducing the distance between the mold 5 and substrate 8 by the driving mechanism of the imprint head 4 and/or the driving mechanism of the substrate stage 9.

As shown in FIG. 1, the irradiation system 20 for irradiating a resin with light for curing the resin is not positioned immediately above the mold 5, but can be positioned such that the optical axis of the irradiation system 20 inclines to the optical axis of the measurement light 11. Ultraviolet light 3 from the irradiation system 20 can enter a resin through the mold 5 without passing through the relay optical system 18. However, the positioning of the irradiation system 20 is not limited to this, and the irradiation system 20 may also be positioned such that its optical axis is parallel to that of the TTM detecting system 300.

The imprint apparatus 17 of the first embodiment includes the deforming mechanism as shown in FIG. 16 or 17, and the deforming mechanism deforms the mold 5 so that the central portion of the mold 5 where the mold-side alignment mark (first mark) 110 is formed protrudes toward the substrate 8. After the operation of reducing the distance between the mold 5 and substrate 8 is started, the TTM detecting system 300 detects the relative positions of the mold 5 and substrate 8 in a state in which the above-mentioned portion of the mold 5 is in contact with the resin on the substrate 8, but the whole pattern region of the mold 5 is not in contact with the resin. The operation of reducing the distance between the mold 5 and substrate 8 is performed by the driving mechanism of the imprint head 4 and/or the driving mechanism of the substrate stage 9. The relative positions of the mold 5 and substrate 8 can be detected by detecting images of the mold-side alignment mark (first mark) 110 and the substrate-side alignment mark (second mark) 12 by the photoelectric conversion device 46, and processing the detected images. Note that in the example shown in FIG. 1, a portion to be initially brought into contact with the resin is the central portion of the mold 5, and the mold-side alignment mark (first mark) 110 is formed in this central portion, but the above-mentioned portion may also be another portion (for example, a portion (for example, a corner) of the peripheral portion).

An imprint apparatus 21 of the second embodiment of the present invention will be explained below with reference to FIG. 2. Note that features not mentioned in the following explanation can follow the first embodiment. In the second embodiment, a TTM detecting system 300 includes a photoelectric conversion device (for example, a CCD) 46, a relay optical system 23, and an illuminating and imaging system 19 positioned between the photoelectric conversion device 46 and relay optical system 23. The relay optical system 23 includes a beam splitter 22. The illuminating and imaging system 19 illuminates a substrate 8 through the relay optical system 23. Also, the illuminating and imaging system 19 forms, on the photoelectric conversion device 46, images of intermediate images of a mold-side alignment mark 110 and substrate-side alignment mark 12. The intermediate images are formed on an intermediate imaging plane 47 between the relay optical system 23 and illuminating and imaging system 19 by light from the substrate 8.

Ultraviolet light 3 emitted from an irradiation system 24 is fed into the beam splitter 22 of the relay optical system 23 through a lens 48, transmitted through a mold 5 after being reflected by the beam splitter 22, and incident on a resin on the substrate 8. Note that for the sake of simplicity, FIG. 2 does not show the refraction of light beams in the beam splitter 22. In practice, however, light beams are slightly shifted when transmitted through the beam splitter 22, except for a light beam on the axis of the relay optical system 23, which perpendicularly enters the beam splitter 22. In the second embodiment, the optical axis of the TTM detecting system 300 and that of the irradiation system 24 are parallel on the surface of the substrate.

An imprint apparatus 25 of the third embodiment of the present invention will be explained below with reference to FIG. 3. Note that features not mentioned in the following explanation can follow each of the above-mentioned embodiments. In the third embodiment, a TTM detecting system 300 includes a photoelectric conversion device (for example, a CCD) 46, a relay optical system 23, and an illuminating and imaging system 19 positioned between the photoelectric conversion device 46 and relay optical system 23. The relay optical system 23 includes a beam splitter 26. The illuminating and imaging system 19 illuminates a substrate 8 through the relay optical system 23. Also, the illuminating and imaging system 19 forms, on the photoelectric conversion device 46, images of intermediate images of a mold-side alignment mark 110 and substrate-side alignment mark 12. The intermediate images are formed on an intermediate imaging plane 47 between the relay optical system 23 and illuminating and imaging system 19 by light from the substrate 8. The optical axis of the TTM detecting system 300 is bent by the beam splitter 26. Ultraviolet light 3 emitted from an irradiation system 24 is transmitted through a lens 50 and the beam splitter 26 of the relay optical system 23, transmitted through a mold 5, and incident on a resin on the substrate 8.

The beam splitter 26 preferably perfectly reflects the light from the illuminating and imaging system 19, and perfectly transmits the light from the irradiation system 24. For example, however, the beam splitter 26 may also reflect 90% of the light from the illuminating and imaging system 19, and transmit 10% of the light from the irradiation system 24. The ratio of the reflection to the transmittance of the beam splitter 26 may of course be, for example, 8:2 or 7:3, instead of 9:1.

Figure 2:
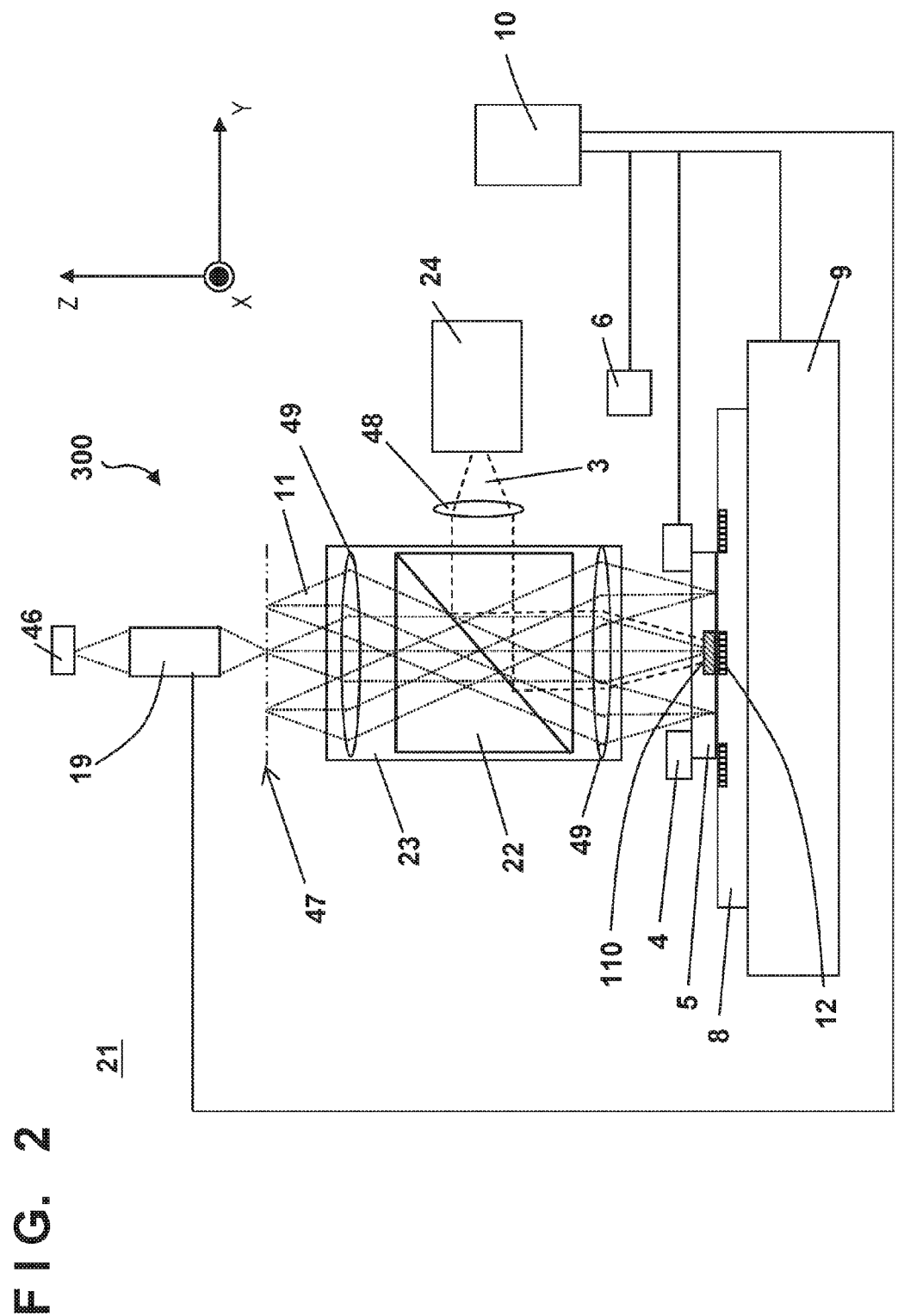
FIG. 2 is a view showing the arrangement of an imprint apparatus according to the second embodiment of the present invention.
Figure 3:
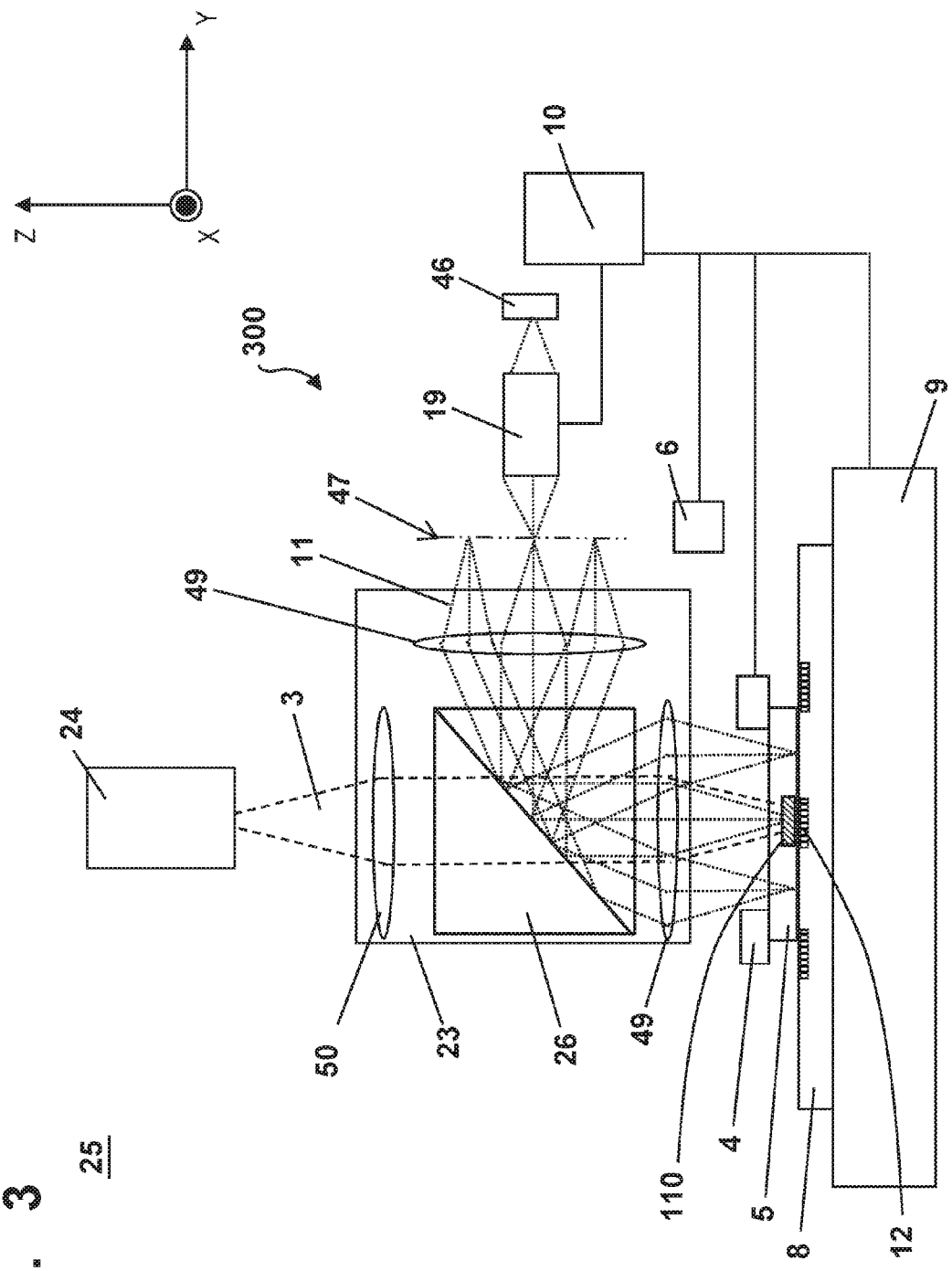
FIG. 3 is a view showing the arrangement of an imprint apparatus according to the third embodiment of the present invention.

The arrangements of the second and third embodiments shown in FIGS. 2 and 3 are advantageous for arranging both the TTM detecting system 300 and irradiation system 24 above the mold 5, while the optical axes of the TTM detecting system 300 and irradiation system 24 are perpendicular to the surface of the substrate 8. Making the optical axis of the TTM detecting system 300 perpendicular to the surface of the substrate 8 is advantageous for increasing the NA (Numerical Aperture) of the TTM detecting system 300. Also, making the optical axis of the irradiation system 24 perpendicular to the surface of the substrate 8 is advantageous for evenly irradiating a shot region on the substrate 8 with light.

An imprint apparatus 31 of the fourth embodiment of the present invention will be explained below with reference to FIG. 4. Note that features not mentioned in the following explanation can follow each of the above-mentioned embodiments. The imprint apparatus 31 of the fourth embodiment includes a plurality of TTM detecting systems. It is advantageous to include a plurality of TTM detecting systems in order to, for example, measure a plurality of portions of a shot region in die-by-die alignment. Even in an imprint apparatus having only one TTM detecting system, a plurality of portions of a shot region can sequentially be observed by driving a substrate stage or the TTM detecting system. However, this method is disadvantageous in that the time required for detection is long and a driving error can occur.

In the fourth embodiment, five TTM detecting systems are arranged above a mold 5, as an example of the layout of a plurality of TTM detecting systems. Although FIG. 4 shows only three TTM detecting systems for the convenience of illustration, TTM detecting systems 33 for detecting mold-side alignment marks (third marks) 150 (see FIG. 12) at the four corners of the mold 5 are arranged. Also, substrate-side alignment marks (fourth marks) corresponding to the mold-side alignment marks (third marks) 150 are formed on a substrate 8. Accordingly, the relative positions of the mold 5 and substrate 8 can be detected by using a set of a mold-side alignment mark 110 and substrate-side alignment mark 12, and a set of the mold-side alignment marks 150 and the corresponding substrate-side alignment marks. The mold-side alignment marks (third marks) 150 shown in FIG. 12 are brought into contact with a resin after the mold-side alignment mark (first mark) 110 is brought into contact with the resin.

The relative positions of the mold 5 and substrate 8 are measured by detecting the mold-side alignment mark 110 initially brought into contact with the resin, and shift correction is performed. After that, magnification correction of the mold 5 can be performed by measuring the magnification component of the mold by detecting the mold-side alignment marks 150 brought into contact with the resin. A component to be obtained by detecting the mold-side alignment marks 150 is not limited to the magnification component, and may also be a rotational component, trapezoidal component, or arch component. It is also possible to obtain a plurality of components and use them when aligning the mold 5 and substrate 8. As described above, the mold 5 and substrate 8 can efficiently be aligned by first performing shift correction and then measuring the relative positions of other components.

Figure 12:
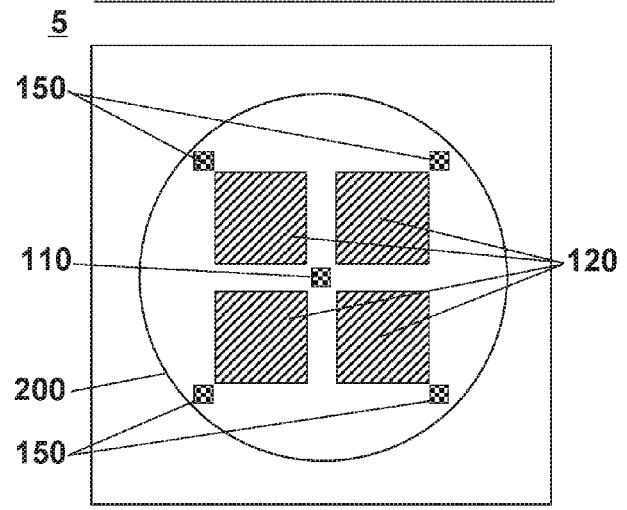
FIG. 12 is a view showing the layout of alignment marks according to an embodiment of the present invention.

The number and positions of additional alignment marks as shown in FIG. 12 are not limited to those of the example shown in FIG. 12, and can be determined in accordance with the component to be obtained (for example, a shift component, magnification component, rotational component, trapezoidal component, or arch component).

Figure 4:
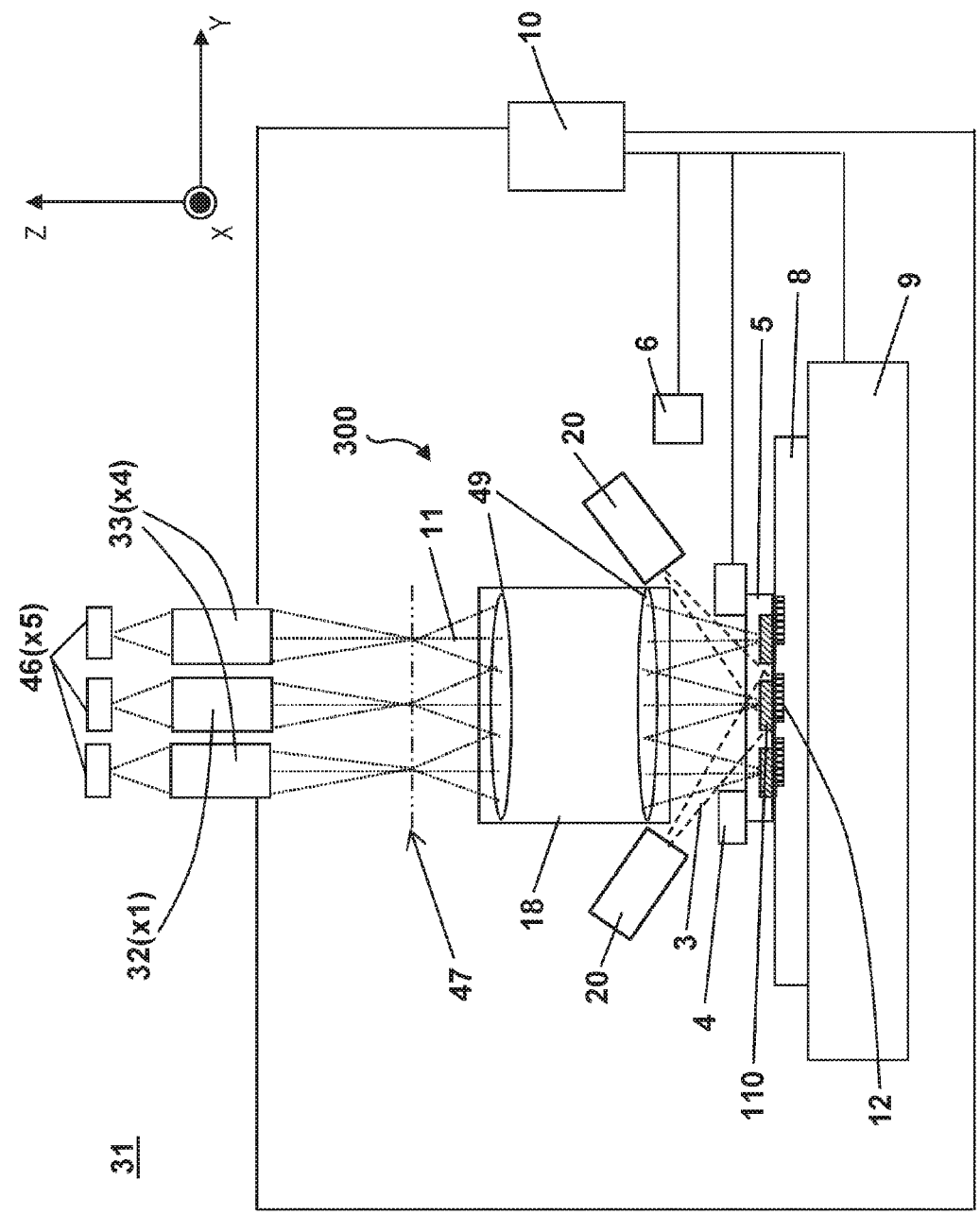
FIG. 4 is a view showing the arrangement of an imprint apparatus according to the fourth embodiment of the present invention.

In the example shown in FIG. 4, the relay optical system 18 is placed above the mold 5, and one TTM detecting system 32 for observing the central portion where the mold starts contacting the resin and the four TTM detecting systems 33 for observing the peripheral portion are arranged above the relay optical system 18. By thus arranging a plurality of TTM detecting systems, the relative positions of the mold 5 and substrate 8 can be detected more accurately. The relay optical system 18 is favorably a telecentric optical system.

Figure 13:
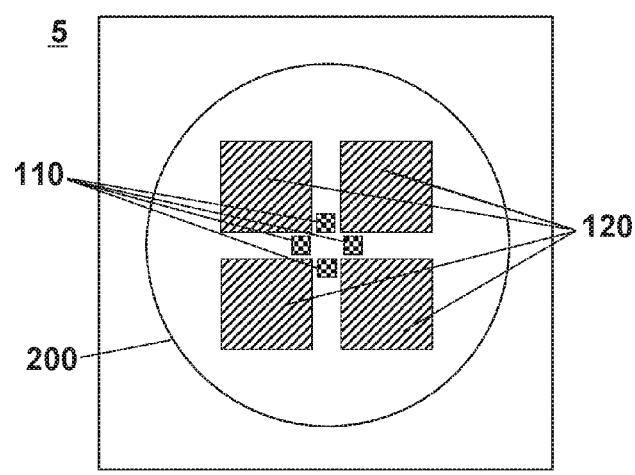
FIG. 13 is a view showing the layout of alignment marks according to an embodiment of the present invention.

Also, as shown in FIG. 13, it is possible to form a plurality of mold-side alignment marks 100 in a region where the mold 5 starts contacting the resin, form corresponding substrate-side alignment marks on the substrate 8, and observe these alignment marks by using one TTM detecting system 32. In this case, the visual field of the TTM detecting system 32 is so designed as to be able to simultaneously observe the plurality of mold-side alignment marks and the plurality of substrate-side alignment marks.

Figure 5:
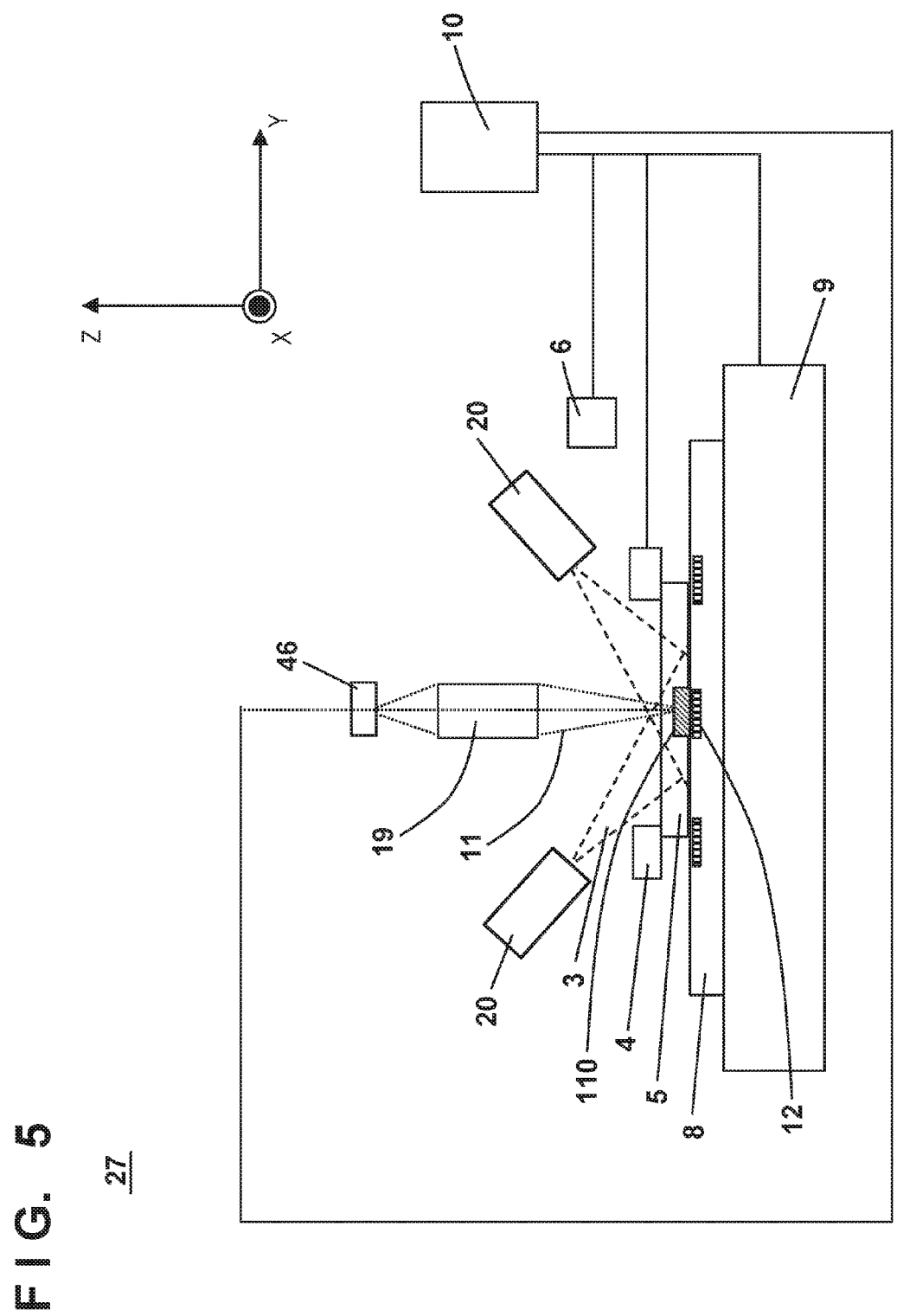
FIG. 5 is a view showing the arrangement of an imprint apparatus as a reference example.

FIG. 5 shows an imprint apparatus 27 as a reference example. In the imprint apparatus 27, a relay optical system is omitted, and a TTM detecting system includes a photoelectric conversion device 46 and illuminating and imaging system 19.

A method of manufacturing an article by using the above-mentioned imprint apparatus will be explained below. This manufacturing method includes a step of forming a resin pattern on a substrate by using the aforementioned imprint apparatus, and a step of processing (for example, etching) the substrate on which the pattern is formed. The article can be a device such as a semiconductor device, liquid crystal display device, or micromachine.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-006557, filed Jan. 16, 2012, which is hereby incorporated by reference herein in its entirety.

What is claimed is:

1. An imprint apparatus for bringing a mold, having a first mark, a third mark, and a pattern region in which a pattern is formed, into contact with an imprint material on a substrate having a second mark and a fourth mark, to form a pattern of the imprint material, the apparatus comprising:
    a detecting unit configured to detect, after the mold and the imprint material on the substrate come in contact with each other, the first mark and the second mark in a state in which a first portion of the mold where the first mark is formed and the imprint material on a first portion of the substrate where the second mark is formed are in contact with each other but a whole of the pattern region is not in contact with the imprint material; and
    a control unit configured to control a relative position of the mold and the substrate based on a detecting result of the first mark and the second mark,
    wherein the first mark and the second mark are formed in respective first portions of the mold and the substrate,
    wherein the third mark and the fourth mark are formed in respective second portions of the mold and the substrate,
    wherein the second portion of the mold and the imprint material on the second portion of the substrate come in contact with each other after the first portion of the mold and the imprint material on the first portion of the substrate come in contact with each other,
    wherein the detecting unit is configured to detect the third mark and the fourth mark after detecting the first mark and the second mark, and
    wherein the control unit is configured to control the relative position of the mold and the substrate based on a detecting result of the third mark and the fourth mark, after controlling the relative position of the mold and the substrate based on the detecting result of the first mark and the second mark.

2. The apparatus according to claim 1, wherein an optical axis of the detecting unit is perpendicular to a surface of the substrate.

3. The apparatus according to claim 1, further comprising a driving mechanism configured to adjust the distance between the mold and the substrate such that the mold and the imprint material on the substrate come in contact with each other,
wherein the detecting unit is configured to detect the relative position of the mold and the substrate by using the first mark and the second mark, in parallel with an operation by a driving mechanism to cause the whole of the pattern region of the mold to come in contact with the imprint material on the substrate.

4. The apparatus according to claim 1, further comprising a driving mechanism configured to adjust the distance between the mold and the substrate such that the mold and the imprint material on the substrate come in contact with each other,
wherein the mold and the substrate are relatively positioned in parallel with an operation by the driving mechanism to cause the whole of the pattern region of the mold to come in contact with the imprint material on the substrate.

5. The apparatus according to claim 1, wherein the second portion of the mold is a peripheral portion of the pattern region of the mold, and wherein, after the peripheral portion of the pattern region where the third mark is formed comes in contact with the imprint material, the detecting unit detects the third mark and the fourth mark, and the mold and the substrate are relatively positioned based on the detected third mark and the detected fourth mark.

6. The apparatus according to claim 1, wherein the mold has a plurality of third marks and the substrate has a plurality of fourth marks such that a plurality of pairs, each of which is constituted by one of the plurality of third marks and one of the plurality of fourth marks, are formed, and
wherein the control unit is configured to control the relative position of the mold and the substrate based on the detecting result of the first mark and the second mark, and obtain at least one of a magnification component, a rotational component, trapezoidal component, or an arch component to be used for aligning the mold and the substrate, based on a plurality of detecting results detected by the detecting unit for the plurality of pairs.

7. The apparatus according to claim 1, further comprising,
a deforming mechanism configured to deform the mold such that a first portion of the mold where the first mark is formed protrudes toward the substrate, and
a driving mechanism configured to adjust the distance between the mold and the substrate such that the mold and the imprint material on the substrate come in contact with each other.

8. A method of manufacturing an article, comprising:
forming a pattern on a substrate by using an imprint apparatus; and
processing the substrate on which the pattern is formed, wherein the imprint apparatus is configured to bring a mold having a first mark, a third mark, and a pattern region in which a pattern is formed, into contact with an imprint material on a substrate having a second mark and a fourth mark, to form the pattern of the imprint material, the imprint apparatus comprising:
a detecting unit configured to detect, after the mold and the imprint material on the substrate come in contact with each other, the first mark and the second mark in a state in which a first portion of the mold where the first mark is formed and the imprint material on a first portion of the substrate where the second mark is formed are in contact with each other but a whole of the pattern region is not in contact with the imprint material; and
a control unit configured to control a relative position of the mold and the substrate based on a detecting result of the first mark and the second mark,
wherein the first mark and the second mark are formed in respective first portions of the mold and the substrate,
wherein the third mark and the fourth mark are formed in respective second portions of the mold and the substrate,
wherein the second portion of the mold and the imprint material on the second portion of the substrate come in contact with each other after the first portion of the mold and the imprint material on the first portion of the substrate come in contact with each other,
wherein the detecting unit is configured to detect the third mark and the fourth mark after detecting the first mark and the second mark, and
wherein the control unit is configured to control the relative position of the mold and the substrate based on a detecting result of the third mark and the fourth mark, after controlling the relative position of the mold and the substrate based on the detecting result of the first mark and the second mark.

9. A method of bringing a mold having a first mark, a third mark, and a pattern region in which a pattern is formed, into contact with an imprint material on a substrate having a second mark and a fourth mark, to form the pattern of the imprint material, the method comprising:
adjusting a distance between the mold and the substrate such that the mold and the imprint material on the substrate come in contact with each other;
detecting, using a detector, after the mold and the imprint material on the substrate come in contact with each other, the first mark and the second mark in a state in which a first portion of the mold where the first mark is formed and the imprint material on a first portion of the substrate where the second mark is formed are in contact with each other but a whole of the pattern region is not in contact with the imprint material; and
controlling a relative position of the mold and the substrate based on a detecting result of the first mark and the second mark,
wherein the first mark and the second mark are formed in respective first portions of the mold and the substrate,
wherein the third mark and the fourth mark are formed in respective second portions of the mold and the substrate,
wherein the second portion of the mold and the imprint material on the second portion of the substrate come in contact with each other after the first portion of the mold and the imprint material on the first portion of the substrate come in contact with each other,
wherein the detecting the third mark and the fourth mark is performed after detecting the first mark and the second mark, and
wherein the controlling the relative position of the mold and the substrate further includes controlling the relative position of the mold and the substrate based on a detecting result of the third mark and the fourth mark, after controlling the relative position of the mold and the substrate based on the detecting result of the first mark and the second mark.

10. The method according to claim 9, further comprising; deforming the mold such that the first portion of the mold where the first mark is formed protrudes toward the substrate.

* * * * *